US006049499A

United States Patent [19]

Sukegawa et al.

[11] Patent Number: 6,049,499

[45] Date of Patent: Apr. 11, 2000

[54] SHARED ELECTRICAL SUPPLY LINE FOR A SEMICONDUCTOR STORAGE DEVICE

[75] Inventors: Shunichi Sukegawa; Shinji Bessho, both of Plano; Masayuki Hira, Dallas, all of Tex.; Yasushi Takahashi, Urawa, Japan; Tsutomu Takahashi, Tachikawa, Japan; Koji Arai, Kodaira, Japan

[73] Assignees: Texas Instruments Incorporated, Dallas, Tex.; Hitachi, Ltd., Tokyo, Japan

[21] Appl. No.: 09/118,169

[22] Filed: Jul. 17, 1998

[30] Foreign Application Priority Data

Jul. 18, 1997 [JP] Japan .................................... 9-194538

[51] Int. Cl.[7] ........................................................ G11C 7/00

[52] U.S. Cl. .............................. 365/228; 365/51; 365/63; 365/206; 365/226

[58] Field of Search ................................ 365/228, 51, 63, 365/206, 226

[56] References Cited

U.S. PATENT DOCUMENTS 4,989,062 1/1991 Takahashi et al. ...................... 257/207

5,293,559 3/1994 Kim et al. ................................ 365/63

*Primary Examiner*—David Nelms
*Assistant Examiner*—Hoai V. Ho
*Attorney, Agent, or Firm*—William B. Kempler; Frederick J. Telecky, Jr.

[57] ABSTRACT

To reduce both the noise level according to separation or short-circuitng of the electrical supply line of the sense amplifiers and the electrical supply line of the word line driving circuit and to effectively prevent destruction of the stored data in the nonselecteded memory cell. Electrical supply line (Vssw) of the power supply voltage with respect to word line driving circuit (SWD) and electrical supply line (Vssa) of power supply voltage with respect to sense amplifier driving circuit (SAD) are arranged separately in memory array area 2 (e.g., in the space in the row direction of memory array (SMAx,y)) and connected to shared electrical supply wiring (Vsso) within peripheral circuit area 3.

5 Claims, 6 Drawing Sheets

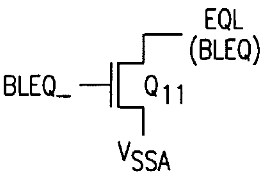
FIG. 6a
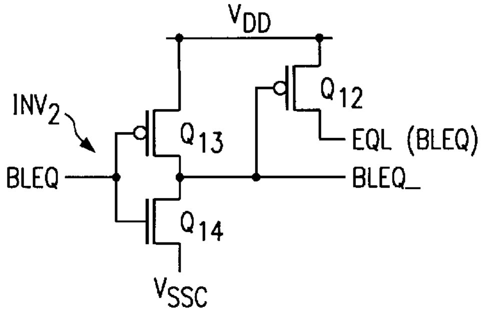
FIG. 6b
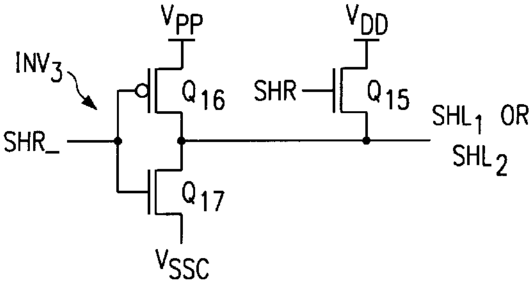
FIG. 7
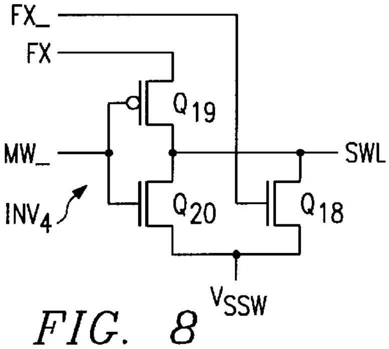
FIG. 8
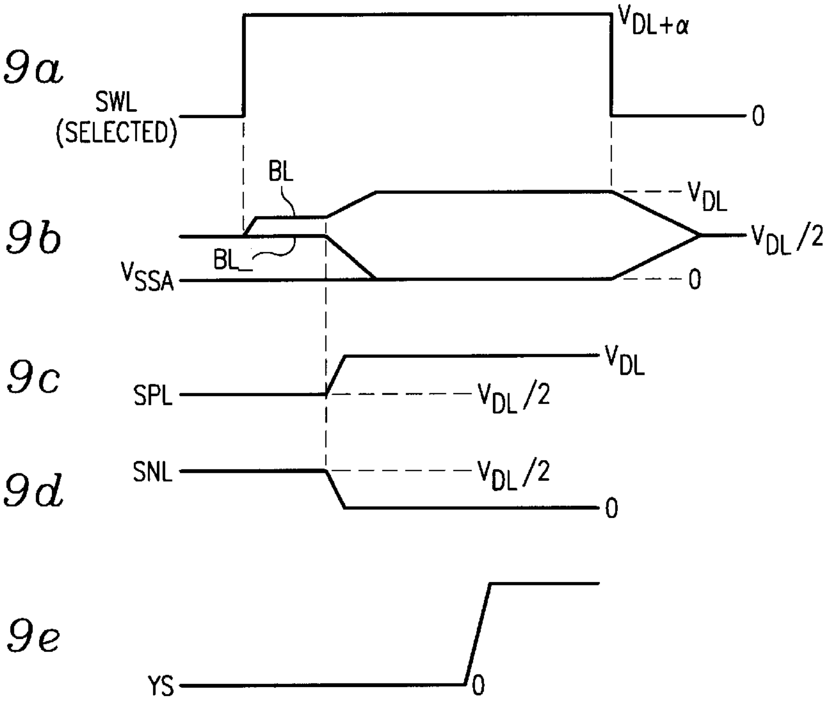
FIG. 9a
FIG. 9b
FIG. 9c
FIG. 9d
FIG. 9e

SHARED ELECTRICAL SUPPLY LINE FOR A SEMICONDUCTOR STORAGE DEVICE

FIELD OF THE INVENTION

The present invention relates to a semiconductor storage device such as DRAM, etc. provided with a wiring in which the potential change in the shared electrical supply line (Vss line) for the power supply voltage does not easily lead to erroneous operation of the memory cells.

BACKGROUND OF THE INVENTION

In a semiconductor storage device such as a large capacity DRAM, etc., enhancement in the performance (enhancement in the speed, reduction in the power consumption, etc.) is generally achieved by dividing the memory array into plural sub-memory arrays.

FIG. 10 is a block diagam showing the main part constitution of a DRAM which shares the sense amplifier between the sub-memory arrays.

In this DRAM 100, many shared sense amplifiers (hereafter referred to simply as sense amplifier (SA)) are arranged within sense amplifier array area 103 positioned between two adjacent sub-memory arrays 101 and 102. A pair of complementary bit lines (BL) and (BL_) for each sub-memory arrays 101 and 102 are connected with respect to each sense amplifier (SA) for total of 2 pairs. These complementary bit lines (BL) and (BL_) are connected to sense amplifier (SA) for each bit line via transfer gate (TG1) or (TG2). Each gate of transfer gate (TG1) on the sub-memory array 101 side is connected to a signal line provided with shared signal (SHL1). Similarly, each gate of transfer gate (TG2) on the sub-memory array 102 side is connected to a signal line provided with shared signal (SHL2).

Sense amplifier (SA) has a CMOS amplifier composition, the power supply feed node of the NMOS amplifier thereof is connected to shared drive line (SNL) and the power supply feed node of the PMOS amplifier thereof is connected to shared drive line (SPL). Two shared drive lines (SNL) and (SPL) are connected to sense amplifier driving circuit 104 arranged on the outside of sense amplifier area 103. Also, power supply voltage feed line which is shared between sense amplifier driving circuits 104 (hereafter referred to as "shared electrical supply line (Vssa) of sense amplifier driving circuits") is arranged in the column direction.

On the other hand, selected transistor (TR) and memory capacitor (C) which compose the respective memory cell is connected at each intersecting point of complementary bit lines (BL) and (BL_) and many word lines (WL) wired in the row direction within sub-memory arrays 101 and 102. The gate of selected transistor (TR) is connected to word line (WL), the drain is connected to either of complementary bit lines (BL) and (BL_), and memory capacitor (C) is connected between the source and a shared plate line not shown in the figure.

Each word line (WL) is connected to word line driving circuit 105 which excites each word line (WL) according to the row selected signal from a row decoder not shown in the figure. The power voltage supply line shared between word line driving circuits 105 (hereafter referred to as shared electrical supply line (Vssw) of word line driving circuits is arranged in the column direction.

In a DRAM semiconductor storage device, etc., the S/N ratio (signal versus noise ratio) in the internal circuit operation decreases when the memory cell and the wiring dimension are refined and the speed is enhanced, and the capacity is enlarged by reducing the voltage. It is necessary to drive the load with a large electric current when enhancing the speed with the power supply voltage left at the reduced state but this electric current flows via a wiring resistor which increases with refinement and enlargement in the chip so that the noise generated in the signal line and the power voltage supply line increases. On the hand, there is a tendency for the voltage amplitude of the memory cell signal to decrease with low voltage operation so that S/N of the internal circuit operation decreases.

As a method for suppressing the generation of noise in order to improve said S/N, a method of achieving reduction in the operating current by restricting the area the electric current flows by dividing the memory array into sub-memory arrays as shown in FIG. 10 while on the other hand dispersing or reducing the load capacity by layering or reducing the resistance of wirings with a high load capacity such as the bit line and word line is generally used. Also, completely preventing noise generation is difficult even when these methods are used, and in a large capacity DRAM in particular, in which the memory cell signal is very weak, contriving a connection method for the wiring and preventing the effect of the noise even if noise is generated is becoming important for improving S/N.

From this point of view, the connecting relationship of the shared electrical supply line (Vssw) of word line driving circuit 105 connected to word line (WL) and shared electrical supply line (Vssa) of sense amplifier driving circuit 104 connected to complementary bit lines (BL) and (BL_) via sense amplifier (SA) and shared drive line (SNL) is vital. The reason is that noise is transmitted as induced noise via the coupled capacity at the intersecting point, etc. of the word line and the bit line but has a tendency to be more directly transmitted via the power supply voltage feed line which is shared.

However, as is well known, noise can be synchronous or asynchronous. In regard to asynchronous noise, all that is necessary is to cut it off by simply separating the power supply voltage feed lines to eliminate the noise propagation but if synchronous noise is also cut off at this time, the voltage limit with respect to erroneous operation may decrease.

For example, in the large capacity RAM in FIG. 10, there is the problem of operational defect of destroying the stored data in the nonselecteded memory cell occurring in both cases of when separating and when short circuiting shared electrical supply line (Vssw) of word line driving circuit 105 and shared electrical supply line (Vssa) of sense amplifier driving circuit 104.

The present invention was made taking said situation into consideration and aims to provide a semiconductor storage device in which said operational drawback of the stored data in the nonselecteded memory cell being destroyed does not occur easily even if the shared electrical supply line of the word line driving circuit and the shared electrical supply line of the sense amplifier driving circuit are short circuited.

SUMMARY OF THE INVENTION

The semiconductor storage device of the present invention for solving said problems of the prior art and achieving said objective has a memory array area which includes memory cell arrays in which memory cells are arranged at the intersecting points of the word lines and the complementary bit lines, word line driving circuits which drive said word lines, sense amplifiers which are connected to said complementary bit lines, and sense amplifier driving circuits which drive said sense amplifier, and a peripheral circuit area which includes a shared electrical supply wiring for feeding the power supply voltage, and the electrical supply wiring for the power supply voltage with respect to said word line driving circuit and the electrical supply wiring for the power supply voltage with respect to said sense amplifier driving circuit are arranged separately in said memory array area and are connected to said shared electrical supply wiring in said peripheral circuit area.

Also, in the semiconductor storage device of the present invention, said word line driving circuits are arranged in the row direction along said memory cell array, said sense amplifiers are arranged in the column direction along said memory cell array, said shared power electrical supply wirings are arranged in the row direction, and the electrical supply wirings which connect said word line driving circuits and said shared electrical supply wirings and the electrical supply wirings which connect said sense amplifier driving circuits and said shared electrical supply wirings are mutually arranged in parallel in the column direction.

Furthermore, in the semiconductor storage device of the present invention, said electrical supply wirings arranged by being separately in said memory array area are wirings for feeding the ground potential.

Generally, the nonselecteded word line is fixed to the ground potential via the word line driving circuit. Consequently, when positive noise is superimposed on the electrical supply wiring which feeds the ground potential to the word line or when negative noise is superimposed on the complementary bit line, the selected transistor of the memory cell connected to the nonselecteded word line conducts instantaneously and may destroy the stored data. For example, when positive noise is superimposed on the nonselecteded word line, 0 data in a memory cell of a memory cell array which inactive is destroyed and when negative noise are superimposed on the complementary bit line, 1 data in a memory cell in a memory cell array which is active are destroyed.

In the semiconductor memory device of the present invention, noise (asynchronous noise) generated on the sense amplifier side and superimposed on the electrical supply wiring of the sense amplifier driving circuit is transmitted to the electrical supply wiring of the word line driving circuit after temporarily being detoured to a shared electrical supply wiring in the peripheral circuit area on the outside part of the memory array area. Consequently, said asychronous noise attenuates to some extent while being transmitted a relatively long wiring and is not at a noise level which could destroy the stored data even if transmitted in the nonselecteded word line.

On the other hand, the noise (synchronous noise) generated in the word line driving circuit, etc., is superimposed on the nonselecteded word line and the complementary bit line via the electrical supply wiring of the sense amplifier driving circuit. This synchronous noise is transmitted in the electrical supply wiring of the sense amplifier driving circuit by being attenuated to a given extent as with the aforementioned asynchronous noise. In this case, the gate terminal and the drain terminal of the selected transistor in the memory cell connected to a nonselecteded word line fluctuates in the same manner so that destruction of the stored data according to instantaneous conduction of the selected transistor is prevented effectively.

It is composed thus of dividing the electrical supply wiring the word line driving circuit and the sense amplifier driving circuit in the memory array area and connecting with the shared electrical supply wiring in the peripheral circuit area, so that even if noise is transmitted in both the complementary bit line and the nonselecteded word line, the noise level is attenuated in regard to various noises generated on the word line driving circuit side and the sense amplifier side. As a result, the fluctuation level of the complementary bit line and the nonselecteded word line which generate destruction of the stored data are adjusted in a range which does not create a problem in cases of both synchronous noise and asynchronous noise.

BRIEF DESCRIPTION OF THE DRAWINGS

FIG. 6 is a circuit configuration showing the equalizer driving circuit.

FIG. 7 is a circuit configuration showing a shared driving circuit which drives the shared signal line.

FIG. 8 is a circuit configuration showing the sub-word line driving circuit arranged at each branching point in the layered structure of the word lines.

FIG. 9 is a timing chart of each signal indicating the data read operation of a 64 Mb DRAM related to the present application example.

REFERENCE NUMERALS AND SYMBOLS AS SHOWN IN THE DRAWINGS

1 represents a DRAM (semiconductor storage device), 2 a memory array block, 3 a peripheral circuit area (outside area), 4 an array controller, 5 a bonding pad of the shared power source, (BLEQ) an equalizer drive signal, (EQ) a bit line equalizer, (EQL) an equalizer drive line, (MW) an inversion signal of main word line signal, (MWD) a main word line driving circuit, (MWL) a main word line, (SA) a sense amplifier, (SAA) a sense ampifier array, (SAN) a sense amplifier drive signal, (SHL1), (SHL2) a shared signals, (SMAx,y) a sub-memory array, (SNL) a shared drive line on the NMOS side of the sense amplifier, (SPL) a shared drive line on the PMOS side of the sense amplifier, (SWD) a sub-word line driving circuit, (SWL) a sub-word line, (TGi), (Tgi+1) a transfer gates, (Vss) a shared electrical supply line, (Vssa) a shared electrical supply line of the sense amplifier, (Vssc) a shared electrical supply line of the array controller, (Vsso) a trunk line of shared electrical supply line, (Vssw) a shared electrical supply line of the word line driving circuit, (YSD) a driving circuit of the column selected transistor, (YSL) a column selected signal line, (YT1), (YT2) a column selected transistors.

DESCRIPTION OF THE EMBODIMENTS

Below, the semiconductor storage device related to the present invention will be explained in detail with reference to the figures with a 64 Mb DRAM in which the memory array has been multiply divided as an example.

Figure 1A:
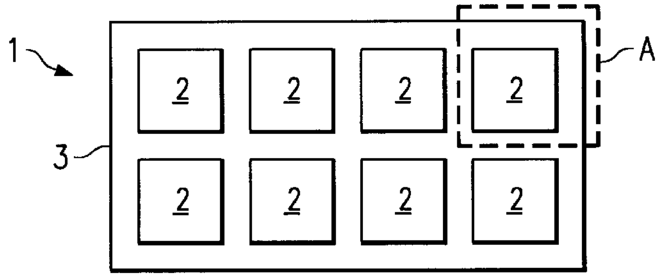
FIG. 1(*a*) is a schematic top view showing the overall constitution of a 64 Mb DRAM related to an application example of the present invention and FIG. 1(*b*) is an enlarged schematic top view showing part A in FIG. 1(*a*).
Figure 1B:
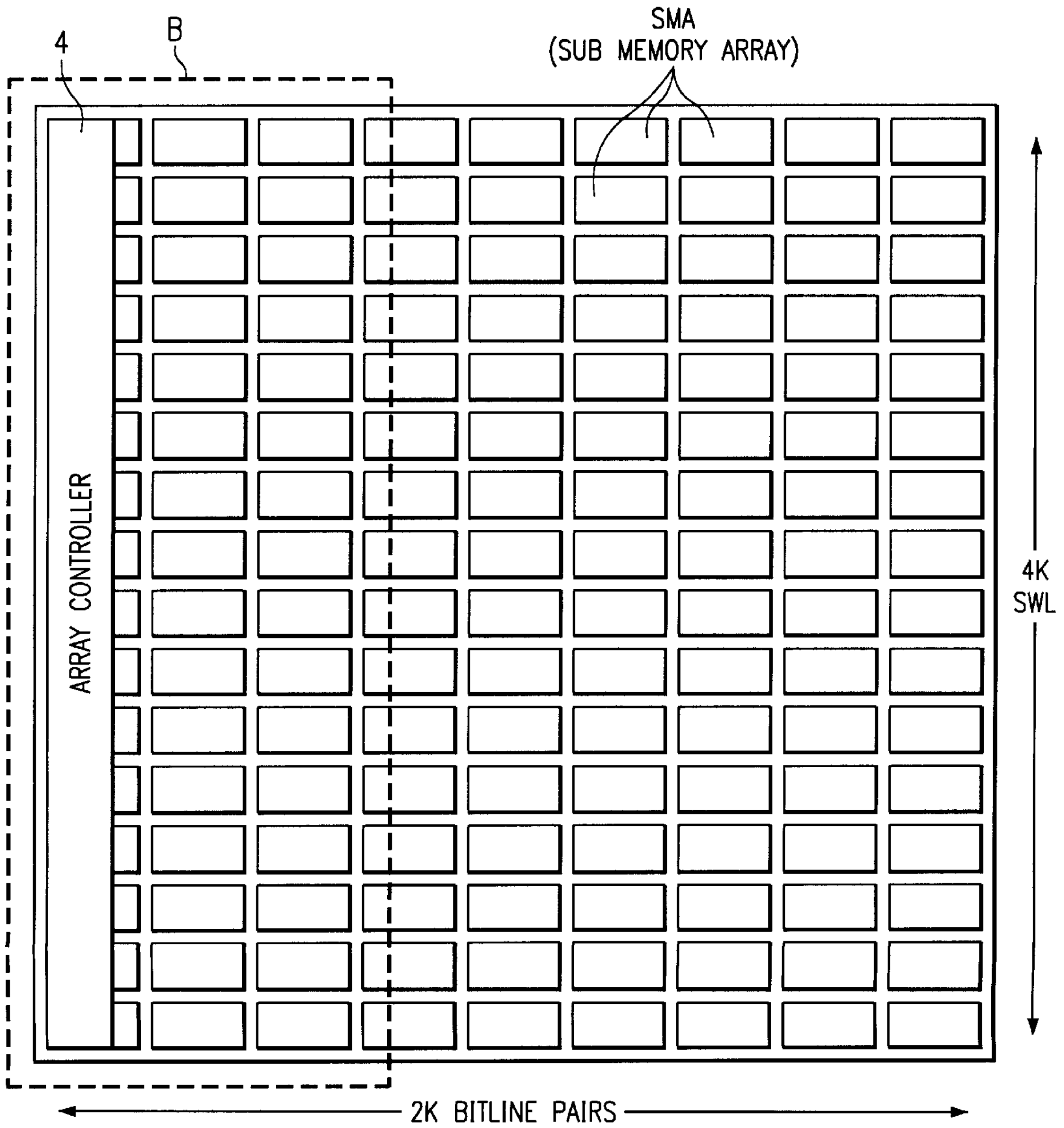

FIG. 1(*a*) is a schematic top view showing the overall constitution of a 64 Mb DRAM related to an application example of the present invention. Also, FIG. 1(*b*) is an enlarged schematic top view showing part A in FIG. 1(*a*) and FIG. 2 is an enlarged function block diagram showing part B in FIG. 1(*b*).

This 64 Mb DRAM 1 is comprised of 8 memory array blocks 2 respectively having a storage capacity of 8Mb and peripheral circuit area 3 provided between thereof as shown in FIG. 1(*a*).

Figure 2:
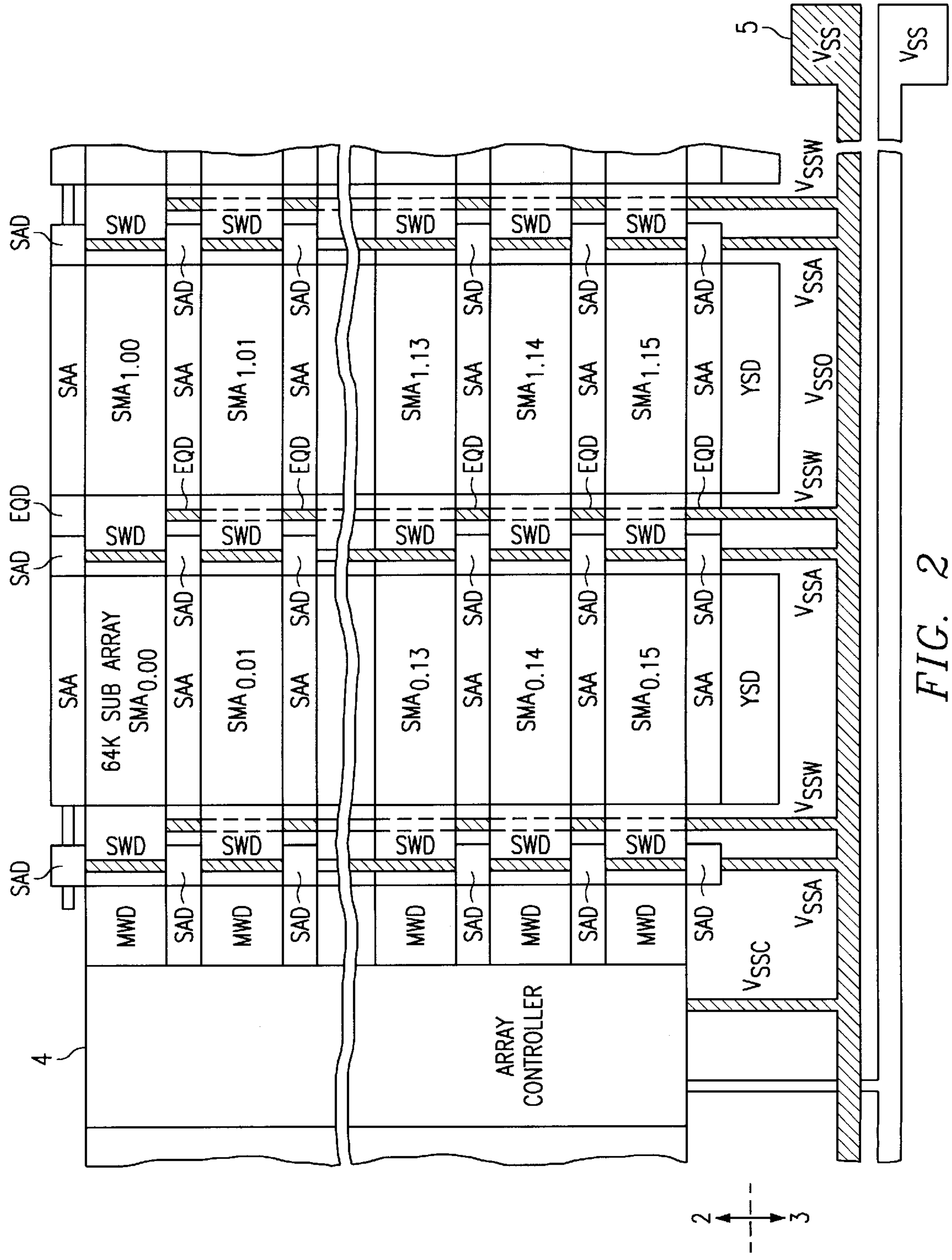
FIG. 2 is an enlarged function block diagram showing part B in FIG. 1(*b*).

One memory array block 2 has 8 horizontal and 16 vertical sub memeory arrays a for total of 128 sub-memory arrays (SMA x,y) (x=0, 1, . . . , I, . . . , 7, y=0, 1, . . . , j, . . . , 15) as shown in he enlargements in FIG. 1(*b*) and FIG. 2. Each sub-memory array (SMAx,y) has a storage capacity of about 64 Kb (kilobits) though a general statement cannot be made since there are those which include some redundant memory cells. A total of about 2000 bit line pairs are wired in the column (vertical) direction in one memory array block 2. Also, the word lines are layered by branching plural sub-word lines (SWL) from one main word line (MWL) and about 4000 sub-word lines (SWL) are wired in the row (horizontal) direction in one memory array block 2 as will be discussed later.

Array controller 4 is arranged in parallel to the column of sub-memory array (SMAx,y). Also, 16 main word line driving circuits (MWD) are arranged adjacent to array controller 4 between the short side (the side along the column direction) of sub-memory array (SMAx,y) and said array controller 4.

As shown in FIG. 2, sense amplifier array (SAA) is arranged repeatedly in a matrix at both ends in the column direction and in the space in the row direction of sub-memory array (SMAx,y). Also, sub-word line driving circuit (SWD) is arranged repeatedly in a matrix on both ends in the row direction and in the space in the row direction of sub-memory array (SMAx,y).

Figure 3:
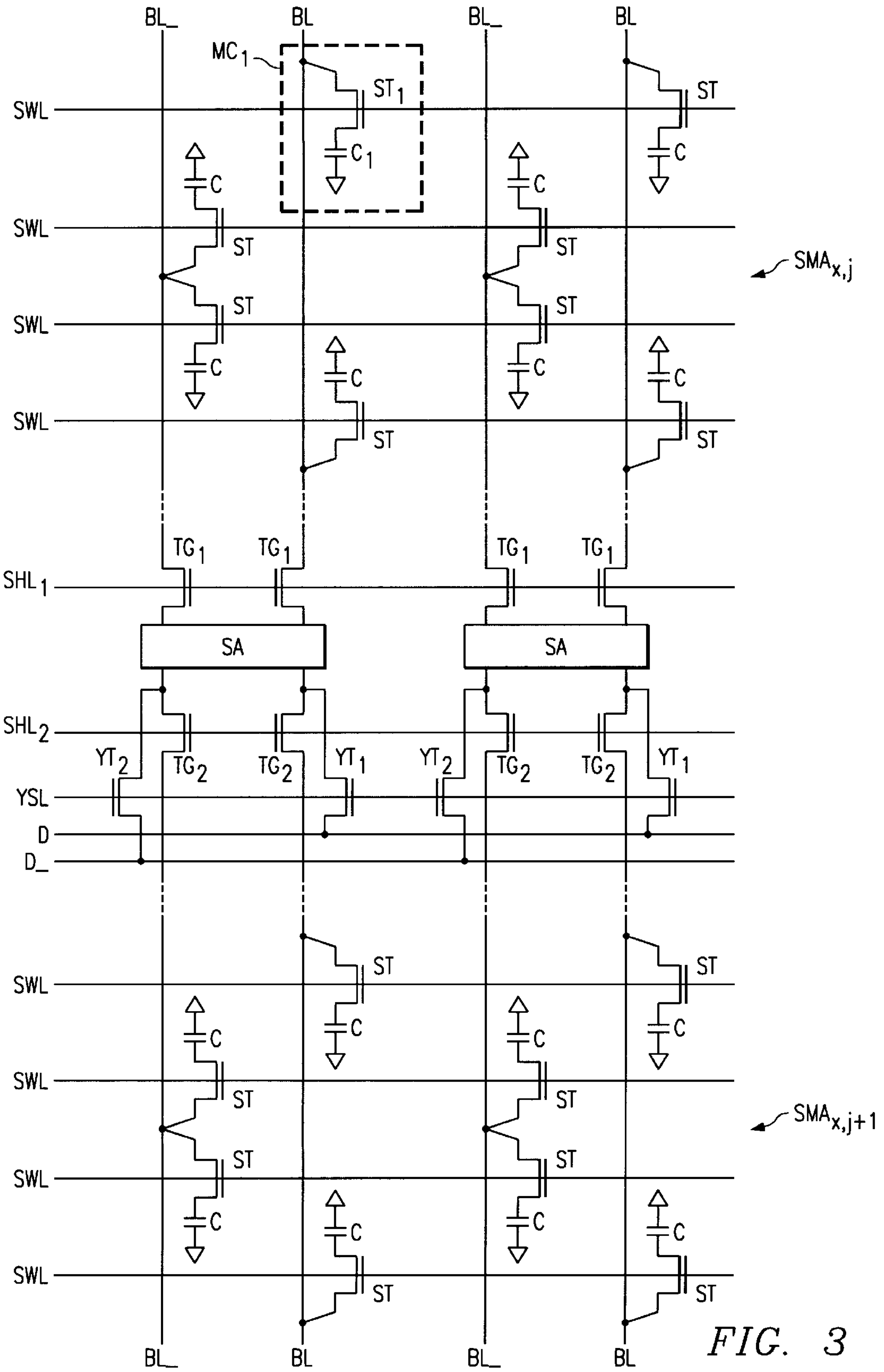
FIG. 3 is an enlarged circuit configuration showing the sub-memory array on both sides in the column direction and the sense amplifier array.
Figure 4:
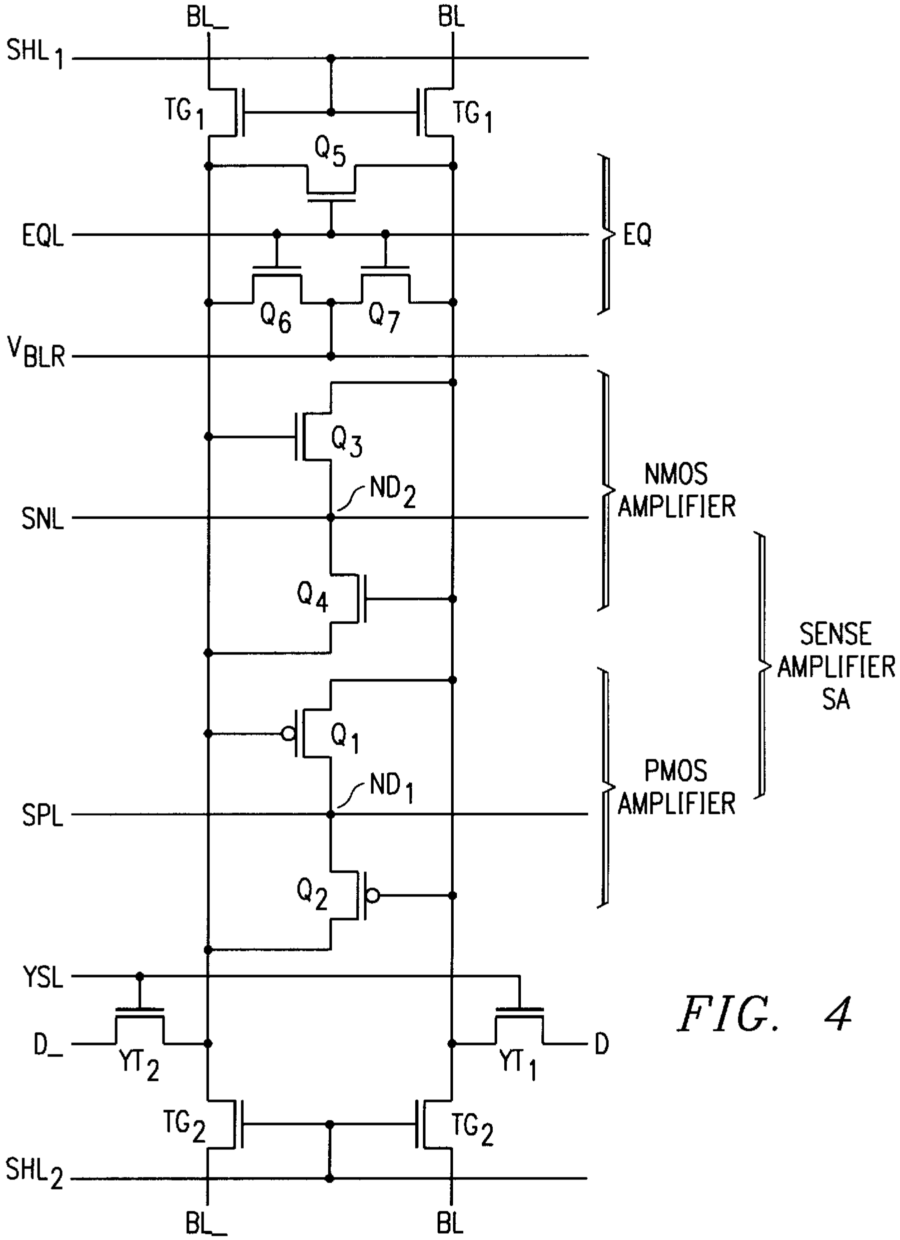
FIG. 4 is a circuit configuration showing the compositional unit of the sense amplifier array.

FIG. 3 is an enlarged circuit configuration showing sub-memory arrays (SMAx,j) and (SMAx,j+1) on both sides in the column direction and sense amplifier array (SAA). Also, FIG. 4 is a circuit configuration showing the compositional unit of sense amplifier array (SAA).

Sub-memory array (SMAx,j) has many complementary bit lines (BL) and (BL__) wired in the column direction and many sub-word lines (SWL) wired in the row direction, and memory capacitor (C) and selected transistor (ST) composing the memory cell are connected to the signal lines thereof. The gate of selected transistor (ST), the gate thereof is connected to sub-word line (SWL), the drain is connected to one out of complementary bit lines (BL) and (BL__), and the source is connected to the storage node of memory capacitor (C). The other node of memory capacitor (MC) is connected to the shared plate line not shown in the figure.

Bit lines (BL) and (BL__) of sub-memory array (SMAx,j) are connected to one of the input terminals of sense amplifier (SA) via transfer gate (TG1) in which the gate is connected to shared signal line (SHL1). Similarly, complementary bit lines (BL) and (BL__) of sub-memory array (SMAx,j+1) are connected to the other input terminal of sense amplifier (SA) via transfer gate (G2) in which the gate is connected to shared signal line (SHL2).

Sense amplifier (SA) is a CMOS amplifier comprised of a PMOS amplifier and NMOS amplifier. The PMOS amplifier is comprised of first PMOS transistor (Q1) in which the drain is connected to complementary bit line (BL) and the gate is connected to complementary bit line (BL__) and second PMOS transistor (Q2) in which the source is connected to the source of said first PMOS transistor (Q1), the drain is connected to complementary bit line (BL__), and the gate is connected to bit line (BL). Node (ND1) in which the mutual sources are connected is connected to shared drive line (SPL). Similarly, NMOS amplifier is comprised of first NMOS transistor (Q3) in which the source is connected to bit line (BL) and the gate is connected to complementary bit line (BL__) and second NMOS transistor (Q4) in which the source is connected to the source of first NMOS transistor (Q3), the drain is connected to complementary bit line (BL__), and the gate is connected to bit line (BL). Node (ND2), in which the mutual sources are connected, is connected to shared drive line (SNL).

Bit line equalizer (EQ) is connected to complementary bit lines (BL) and (BL__) between said sense amplifier (SA) and one of the transfer gate pair (e.g., TG1, TG1). Bit line equalizer (EQ) is for short circuiting complementary bit lines (BL) and (BL__) and setting them at the same potential other than when the data reading or writing operation is being performed. Bit line equalizer (EQ) is comprised of transistor (Q5) in which either the source or the drain is connected to bit line (BL) and the other is connected to complementary bit line (BL__) and transistors (Q6) and (Q7) in which the drains are mutually connected and the source is connected respetively to bit line (BL) and complementary bit line (BL__). Mutually connected drains of transistors (Q6) and (Q7) are connected to voltage feed line ($V_{BLR}$) which feeds a voltage of $V_{DL}/2$. These three transistors (Q5)–(Q7) are shared and connected to equalizer drive line (EQL). Said bit line equalizer (EQ) and equalizer drive line (EQL) are omitted in FIG. 3.

Column selected transistor pair (YT1) and (YT2) are connected between sense amplifier (SA) and transfer gate pairs (TG2) and (TG2). In column selected transistor (YT1), either the source or the drain thereof is connected to bit line (BL), the other is connected to data line (D), and the gate is connected to column selected signal line (YSL). Also, in column selected transistor (YT2), either the source or the drain is connected to complementary bit line (BL__), the other is connected to data complementary line (D__), and the gate is connected to column selected signal line (YSL).

In FIG. 2, sense amplifier driving circuits (SAD) which drive the sense amplifier by changing the voltage of shared drive lines (SPL) and (SNL) of sense amplifier (SA) are dispersed in array controller 4 and the cross area at which sense amplifier arrays (SSA) and sub-word line driving circuits (SWD) contact from four sides.

Figure 5A:
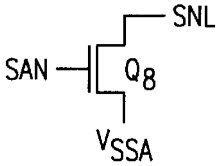
FIG. 5 is a circuit configuration showing the part which drives the shared drive line out of the sense amplifier driving circuit.
Figure 5B:
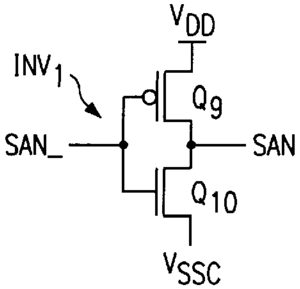
Figure 10:
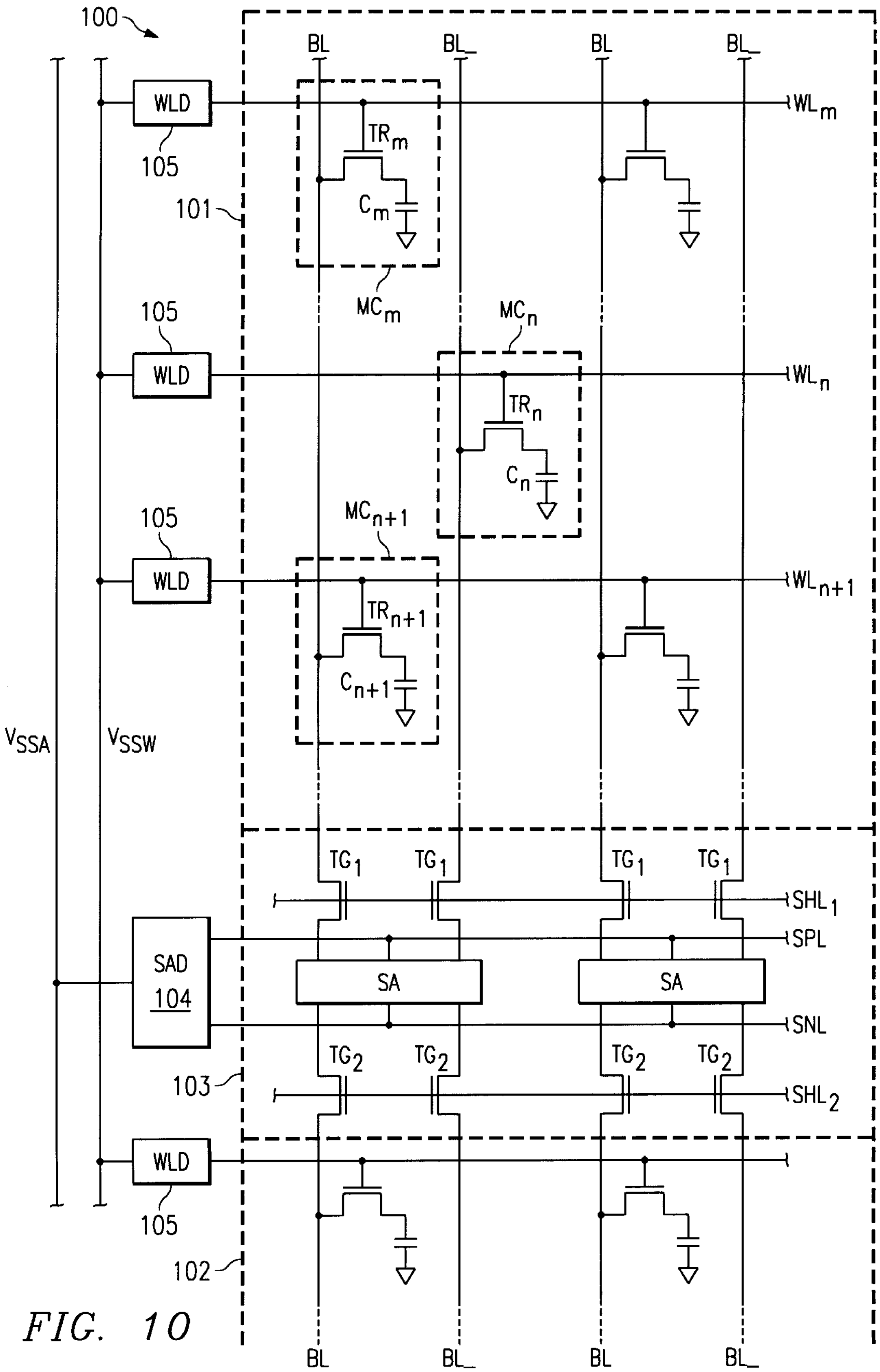
FIG. 10 is a block diagram showing the main part constitution of a conventional DRAM.

FIG. 5 shows the part which drives shared drive line (SNL) from said sense amplifier driving circuit (SAD).

This sense amplifier driving circuit part is comprised of driving transistor (Q8) (FIG. 5(*a*)) which is respectively arranged at said cross area and inverter (INV1) (FIG. 5(*b*)) in which the output terminal arranged in array controller 4 is connected to the gate of driving transistor (Q8). Driving transistor (Q8) is connected to shared drive line (SNL) in which the drain thereof can be shared between plural sense amplifiers (SA) within one sense amplifier array (SSA) and the source is connected to shared electrical supply line (Vssa) for the sense amplifier driving circuit. Inverter (INV1) is comprised of PMOS transistor (Q9) and NMOS transistor (Q10). The drains of both MOS transistors (Q9) and (Q10) are shared and the connecting point thereof composes the output terminal of inverter (INV1). Also, the gates of MOS transistors (Q9) and (Q10) are shared, composing the input terminal of inverter (INV1), the source of PMOS transistor (Q9) is connected to feed line ($V_{DD}$) for the power supply voltage, and the source of NMOS transistor (Q10) is connected to shared electrical supply line (Vssc) for the array controller.

Drive circuits (EQD) of bit line equalizer (EQ) (FIG. 4) which control the release and short circuiting of complementary bit lines (BL) and (BL_) are dispersed in the cross area and array controller 4 in FIG. 2.

FIG. 6 shows equalizer driving circuit (EQD).

This equalizer driving circuit (EQD) is comprised of NMOS transistor (Q11) (FIG. 6(*a*)) for driving the equalizer arranged for every other one in the row direction of said cross area, PMOS transistor (Q12) (FIG. 6(*b*)) for driving the equalizer, and inverter (INV2) arranged in array controller 4. The drain of equalizer driving NMOS transistor (Q11), is connected to equalizer drive line (EQL) shared by plural bit line equalizers (EQ) within one sense amplifier array (SSA) and the source is connected to shared electrical supply line (Vssa) for the sense amplifier driving circuit. Inverter (INV2) is comprised of PMS transistor (Q13) and NMOS transistor (Q14). The drains of MOS transistors (Q13) and (Q14) are shared and the connecting point composes the output terminal of inverter (INV2). The gates of MOS transistors (Q13) and (Q14) are shared, compose the input terminal of inverter (INV2), the source of PMOS transistor (Q13) is connected to feed line ($V_{DD}$) for the power supply voltage, and the source of NMOS transistor (Q14) is connected to shared electrical supply line (Vssc) for the array controller. In equalizer driving PMOS transistor (Q12), the source is connected to feed line ($V_{DD}$) for the power supply voltage, the drain is connected to said equalizer drive line (EQL), and the gate is connected to the output terminal of inverter (INV2).

FIG. 7 shows the shared driving circuit which drives shared signal lines (SHL1) and (SHL2).

This shared driving circuit is comprised of driving inverter (INV3) and pullup transistor (Q15). Driving inverter (INV3) is comprised of PMOS transistor (Q16) and NMOS transistor (Q17). The drains of MOS transistors (Q16) and (Q17) are shared and the connecting point (output terminal of INV3) is connected to shared signal line (SHL1) or (SHL2) in FIG. 4. Also, the gates of MOS transistors (Q16) and (Q17) are shared and compose the input terminal of inverter (INV3), the source of PMOS transistor (Q16) is connected to feed line (Vpp) for the power supply voltage, and the source of NMOS transistor (Q17) is connected to shared electrical supply line (Vssc) for the array controller. In pullup transistor (Q15), the drain is connected to feed line ($V_{DD}$) for the power supply voltage, the source is connected to said shared signal line (SHL1) or (SHL2), and the gate is connected to the output terminal of inverter (INV3).

In this 64 Mb DRAM 1, plural (e.g., eight) sub-word lines are branched in one main word line and the word lines are layered, although not shown in detail.

FIG. 8 shows a sub-word ine driving circuit arranged at each branching point which layers the word lines. This sub-word line driving circuit (SWD) is comprised of driving inverter (INV4) and pulldown transistor (Q18) of sub-word line (SWL). Driving inverter (INV4) is comprised of PMOS transistor (Q19) and NMOS transistor (Q20). The drains of MOS transistors (Q19) and (Q20) are shared and the connecting point (output terminal of INV4) is connected to sub-word line (SWL) in FIG. 3. Also, the gates of MOS transistors (Q19) and (Q20) are shared and compose the input terminal of inverter (INV4), and inversion signal (MW-) of main word line (MWL) is input to this input terminal. The source of NMOS transistor (Q20) is connected to shared electrical supply line (Vssw) of sub-word line driving circuit (SWD). In pulldown transistor (Q18), the drain is connected to sub-word line (SWL) and the source is connected to shared electrical supply line (Vssw) of sub-word line driving circuit (SWD). The gate of pulldown transistor (Q18) and the source of PMOS transistor (Q19) composing inverter (INV4) are connected to the output terminal of the FX driver provided in shared with respect to plural word line driving circuits (SWD) connected to one main word line (MWL). This FX driver is connected to a column decoder not shown in the figure, sub-word line selected signal (FX) is provided to it by the source of PMOS transistor (Q19), and inversion signal (FX-) of sub-word line selected signal (FX) is provided to the gate of pulldown transistor (Q18).

DRAM 1 with this type of circuit configuration is characterized by the connecting relationship of shared electrical supply line (Vssw) of sub-word line driving circuit (SWD) and shared electrical supply line (Vssa) of sense amplifier driving circuit (SAD).

Namely FIG. 2 shows the bonding pad 5 which supplies shared electrical supply voltage (Vss) and trunk line (Vsso) for the shared electrical supply line wired in peripheral circuit area 3 from said bonding pad 5 in peripheral circuit area 3 (refer to FIG. 1) positioned on the outside of memory array block 2. Then, shared electrical supply line (Vssa) for the sense amplifier which feeds the power supply voltage to the circuit in FIG. 5(*a*) and FIG. 6(*a*) is wired in the arranged spacing of sub-memory array (SMAx,y) in the form of branching from trunk line (Vsso) for the shared electrical supply line. Similarly, shared electrical supply line (Vssw) for the word line driving circuit which feeds power supply voltage to the circuit in FIG. 8 is wired in the arranged spacing of sub-memory array (SMAx,y) the a form of branching from trunk line (Vsso) for the shared electrical supply line. The effect of this type of wiring has on the circuit operation will be discussed later.

Next, the data readout operation of the 64 Mb DRAM 1 composed in this way will be explained using the timing chart in FIG. 9. Here FIG. 9 is a timing chart for when the charge is maintained with internal power supply voltage $V_{DL}$≈2.2 V) in memory cell (MC1) of FIG. 3 and this stored data is to be read.

In a standby state prior to the data read operation, complementary bit lines (BL) and (BL_) and shared drive lines (SNL) and (SPL) are precharged to a voltage of $V_{BLR}$ ($=V_{DL}/2\approx 1.1$ V). Namely, shared signal lines (SHL1) and (SHL2) and equalizer drive line (EQL) are the "H" level in FIG. 4 so that transfer gate pairs (TG1), (TG1) and (TG2), (TG2) and transistors (Q5), (Q6), and (Q7) are in the ON (conductive) state and transistors (Q1), (Q2), (Q3), and (Q4) are in the OFF (non-conductive) state. Therefore, complementary bit lines (BL) and (BL_) are precharged to a voltage of $V_{BLR}$.

Next, when the data read operation is started, equalizer drive line (EQL) is changed to the "L" level, transistors (Q5), (Q6), and (Q7) make a transition to the OFF (nonconductive) state, and precharging of complementary bit lines (BL) and (BL_) is cancelled. Next, shared signal lines (SHL1) and (SHL2) on the sub-memory array side in which the sub-word line (SWL) to be selected exists maintains the "H" level and shared signal lines (SHL1) and (SHL2) on the sub-memory array side in which the sub-word line (SWL) to be selecteded does not exist changes to the "L" level. Therefore, complementary bit lines (BL) and (BL_) on the sub-memory array side in which the sub-word line (SWL) to be selecteded does not exist is cutoff from sense amplifier (SA).

Next, main word line (MWL) and sub-word line (SWL) are selecteded; however, prior to this selectedion, sub-word line selected; signal (FX) in sub-word line driving circuit (SWD) of FIG. 8 is "L" and inverter (INV4) is not activated. Also, inversion signal (FX-) is "H" and pulldown transistor (Q18) is in the conductive state so that this nonselecteded sub-word line (SWL) is connected to shared electrical supply line (Vssw).

First, one main word line (MWL) is selecteded by main word line driving circuit (MWD) and inversion signal (MW-) of the main word line signal is pulled down to "L" from "H." Also, one of the plural sub-word line driving circuits (SWD) connected to selecteded main word line (MWL) is driven by the FX driver and the column decoder not shown in the figure and sub-word line (SWL) it is connected to is excited. Specifically, sub-word line selected signal (FX) becomes "H" and inverter (INV4) is activated while on the other hand inversion signal (FX-) becomes "L," pulldown transistor (Q18) makes a transition to the OFF state, and sub-word line (SWL) is cutoff from shared electrical supply line (Vssw). As a result, sub-word line (SWL) is pulled up to a prescribed potential (e.g., internal power supply voltage $V_{DL}+\alpha$). Specifically, this $V_{DL}+\alpha$ is "H" level voltage $V_{PP}\approx3.8$ V) of sub-word line selected signal (FX).

In this way, selected transistor (ST1) of memory cell (MC1) makes a transition to the ON state, the charge maintained in the storage node of memory capacitor (C1) flows to bit line (BL), and the potential of this bit line (BL) rises slightly (about a few hundred mV).

Next, the NMOS amplifier and PMOS amplifier of sense amplifier (SA) are driven by sense amplifier driving circuit (SAD) in FIG. 5. Prior to this drive, sense amplifier drive signal (SAN) in sense amplifier driving circuit (SAD) is "L" so that driving transistors (Q8) dispersed between sub-memory arrays (SMAx,y) are in the OFF state, thus shared drive line (SNL) is maintained at, for example, voltage $V_{DL}/2$. Also, shared drive line (SPL) is maintained at voltage $V_{DL}/2$ by a PMOS amplifier drive part not shown in the figure.

When inversion signal (SAN-) of sense amplifier drive signal (SAN) makes a transition from "H" to "L," sense amplifier drive signal (SAN) makes a transition from "L" to "H" according to inverter (INV1), shared drive line (SNL) is connected to shared electrical supply line (Vssa) by driving transistor (Q8) being conducted, and is pulled down to zero potential. In this way, the NMOS amplifier of sense amplifier (SA) is driven and complementary bit line (BL_) at a lower potential drops until it is at zero potential.

At the same time, shared drive line (SPL) connected to the PMOS amplifier is pulled up to $V_{DL}$ according to a PMOS amplifier drive part not shown in the figure of sense amplifier driving circuit (SAD) and in this way, the PMOS amplifier of sense amplifier (SA) is driven and bit line (BL) at a of higher potential is raised until it is at the internal power supply voltage $V_{DL}$. As a result, potential change (cell data signal) in bit line (BL) according to the inflow of electric current from memory cell (MC1) is amplified to the amplitude of internal power supply voltage $V_{DL}$ (e.g., 2.2 V) on complementary bit lines (BL) and (BL_).

When column selected signal (YS) is provided to column selected signal line (YSL) thereafter, the cell data signal after said amplification is output to the outside after being read to complementary data lines (D) and (D_) by column selected transistors (YT1) and (YT2) which conduct according to being provided with column selected signal (YS).

In DRAM 1 related to an application example of the present invention shown in FIG. 2, noise (asynchronous noise) generated on the sense amplifier side and superimposed on shared electrical supply line (Vssa) of sense amplifier driving circuit (SAD) is transmitted to shared electrical supply line (Vssw) of sub-word line driving circuit (SWD) after temporarily being detoured to trunk line (Vsso) of shared electrical supply line wired in peripheral circuit area 3 outside the memory array. Consequently, this asynchronous noise attenuates to a given level while being transmitted over relatively long wiring and does not become a noise level which can destroy the stored data when nonselecteded sub-word line (SWL) is reached.

On the other hand, the noise (synchronous noise) generated in, for example, sub-word line driving circuit (SWD), etc., is superimposed on nonselecteded sub-word line (SWL) via another sub-word line driving circuit (SWD). This synchronous noise is superimposed on shared electrical supply line (Vssa) of sense amplifier driving circuit (SAD) after temporarily being detoured to trunk line (Vsso) of shared electrical supply line from shared electrical supply line (Vssw) of sub-word line driving circuit (SWD) in the same manner as said asynchronous noise. Then, this synchronous noise is transmitted reliably to the bit line (complementary bit line BL_) on the low voltage side though attenuated via conducted NMOS transistor (Q4) of sense amplifier (SA). In this way, the drain potential also fluctuates synchronously with the fluctuation in the gate potential of selected transistor (TR) of the nonselecteded memory cell. As a result, destruction of the stored data according to instantaneous conduction of the selected transistor is prevented.

Namely, by wiring through detouring shared electrical supply lines (Vssa) and (Vssw), in this way the noise level is attempted while transmitting reliably with respect to various noise generated in sub-word line driving circuit (SWD) or the sense amplifier (SA) side and transmitted between the nonselecteded sub-word line and the bit line connected to shared electrical supply line (Vssa) via the sense amplifier. As a result, the fluctuation level of the bit line or the nonselecteded word line which cause destruction of the stored data is adjusted in a range which does not pose a problem in the cases of both synchronous noise and asynchronous noise.

As explained above, a semiconductor storage device can be provided according to the present invention in which the operational drawback of destroying the stored data in a nonselecteded memory cell does not occur easily even if the shared electrical supply line of the word line driving circuits and the shared electrical supply line of the sense amplifier driving circuits are short circuited.

We claim:

1. A semiconductor storage device comprising a memory array area which includes memory cell arrays in which memory cells are arranged at intersecting points of word lines and complementary bit lines, word line driving circuits which drive said word lines, sense amplifiers which are connected to said complementary bit lines, and sense amplifier driving circuits which drive said sense amplifier, and a peripheral circuit area which includes a shared electrical supply wiring for feeding a power supply voltage, and electrical supply wirings for the power supply voltage with respect to said word line driving circuits and electrical supply wirings for the power supply voltage with respect to said sense amplifier driving circuits are arranged separately in said memory array area and are connected to said shared electrical supply wiring only in said peripheral circuit area.

2. A semiconductor storage device comprising a memory array area which includes memory cell arrays in which memory cells are arranged at intersecting points of word lines and complementary bit lines, word line driving circuits which drive said word lines, sense amplifiers which are connected to said complementary bit lines, and sense amplifier driving circuits which drive said sense amplifier, and a peripheral circuit area which includes a shared electrical supply wiring for feeding a power supply voltage, and electrical supply wiring for the power supply voltage with respect to said word line driving circuits and electrical supply wiring for the power supply voltage with respect to said sense amplifier driving circuits are arranged separately in said memory array area and are connected to said shared electrical supply wiring in said peripheral circuit area, in which said word line driving circuits are arranged in a row direction along said memory cell array, said sense amplifier are arranged in a column direction along said memory cell array, said shared electrical supply wirings are arranged in the row direction, and the electrical supply wirings which connect said word line driving circuit and said shared electrical supply wiring and the electrical supply wirings which connect said sense amplifier driving circuits and said shared electrical supply wirings are mutually arranged in parallel in the column direction.

3. The semiconductor storage device of claim 1 wherein said electrical supply wirings arranged separately in said memory array area are wirings for feeding a ground potential.

4. The semiconductor storage device of claim 2 wherein said electrical supply wirings arranged separately in said memory array area are wirings for feeding a ground potential.

5. The semiconductor storage device of claim 2 wherein said electrical supply wiring for the power supply voltage which connect said word line driving circuit and said electrical supply wirings which connect said sense amplifier are connected only in said peripheral area.

* * * * *